(12) United States Patent
Palma

(10) Patent No.: US 11,718,909 B2
(45) Date of Patent: Aug. 8, 2023

(54) ASSEMBLY FOR THE DEPOSITION OF SILICON NANOSTRUCTURES

(71) Applicant: UNIVERSITA' DEGLI STUDI DI ROMA "LA SAPIENZA", Rome (IT)

(72) Inventor: Fabrizio Palma, Rome (IT)

(73) Assignee: UNIVERSITA' DEGLI STUDI DI ROMA "LA SAPIENZA"

( * ) Notice: Subject to any disclaimer, the term of this patent is extended or adjusted under 35 U.S.C. 154(b) by 622 days.

(21) Appl. No.: 16/648,080

(22) PCT Filed: Sep. 21, 2018

(86) PCT No.: PCT/IB2018/057310
§ 371 (c)(1),
(2) Date: Mar. 17, 2020

(87) PCT Pub. No.: WO2019/058325
PCT Pub. Date: Mar. 28, 2019

(65) Prior Publication Data
US 2020/0283890 A1    Sep. 10, 2020

(30) Foreign Application Priority Data
Sep. 22, 2017  (IT) .......................... 102017000106479

(51) Int. Cl.
*C30B 35/00* (2006.01)
*C23C 16/02* (2006.01)
(Continued)

(52) U.S. Cl.
CPC ........ *C23C 16/0209* (2013.01); *C23C 16/003* (2013.01); *C23C 16/24* (2013.01);
(Continued)

(58) Field of Classification Search
CPC ..... C30B 29/602; C30B 29/605; C30B 35/00; C23C 16/003; C23C 16/24;
(Continued)

(56) References Cited

U.S. PATENT DOCUMENTS

2011/0085960 A1* 4/2011 Mukasyan ............ C01B 33/023
 423/349
2013/0189838 A1   7/2013 Honda et al.
(Continued)

FOREIGN PATENT DOCUMENTS

EP           1760045      *  3/2007

OTHER PUBLICATIONS

PCT International Search Report and Written Opinion issued by the International Bureau for PCT Application No. PCT/IB2018/057310, dated Dec. 20, 2018, pp. 1-14.

*Primary Examiner* — Robert M Kunemund
(74) *Attorney, Agent, or Firm* — The Belles Group, P.C.

(57) ABSTRACT

An assembly for the deposition of silicon nanostructures comprising a deposition chamber, which is defined by a side wall and by two end walls; a microwave generator, which is adapted to generate microwaves inside the deposition chamber; an electromagnetic termination wall, made of a conductor material and reflecting the microwave radiation, which is such as to create a termination for a TE-mode waveguide and is housed inside the deposition chamber; and a substrate-carrier support, which is made of a dielectric material and on which the substrate is housed on which to perform the growth of silicon nanostructures. The substrate-carrier support is arranged inside the deposition chamber above the termination wall.

8 Claims, 3 Drawing Sheets

(51) Int. Cl.
  *C23C 16/00* (2006.01)
  *C23C 16/24* (2006.01)
  *H01L 21/02* (2006.01)
  *H05B 6/64* (2006.01)
  *C30B 29/60* (2006.01)

(52) U.S. Cl.
  CPC .......... *C30B 29/602* (2013.01); *C30B 29/605* (2013.01); *C30B 35/00* (2013.01); *H01L 21/02532* (2013.01); *H01L 21/02603* (2013.01); *H01L 21/02653* (2013.01); *H05B 6/6402* (2013.01); *Y10T 117/10* (2015.01)

(58) Field of Classification Search
  CPC ......... H01L 21/02532; H01L 21/02603; H01L 21/02653; H05B 6/6402; Y10T 117/10
  See application file for complete search history.

(56) References Cited

U.S. PATENT DOCUMENTS

2015/0235878 A1  8/2015  Suguro
2015/0255317 A1  9/2015  Suguro et al.

\* cited by examiner

# ASSEMBLY FOR THE DEPOSITION OF SILICON NANOSTRUCTURES

CROSS-REFERENCE TO RELATED PATENT APPLICATIONS

The present application is a U.S. national stage application under 35 U.S.C. § 371 of PCT Application No. PCT/IB2018/057310, filed Sep. 21, 2018, which claims priority to Italian Patent Application No. 102017000106479, filed Sep. 22, 2017. The disclosures of the aforementioned priority applications are incorporated herein by reference in their entireties.

TECHNICAL FIELD

The present invention relates to an assembly for the deposition of silicon nanostructures at low temperatures (<250° C.) and, therefore, compatible with a substrate composed of a CMOS integrated circuit.

BACKGROUND ART

For some time now, silicon nanowires (SiNWs) have been considered the main candidates for the manufacture of a large variety of ultra-sensitive sensors. In fact, SiNWs are characterized by a high sensitivity due to their small dimensions and large surface-volume ratio. These characteristics mean that the conductivity of the SiNWs changes considerably by contact with even a small quantity of charged molecules or particles. By exploiting this important property, a variety of nanosensor devices have been adapted for the detection of various biological and chemical objectives including control of DNA, of particular proteins, small molecules, metal ions and chemical species, and single viral particles.

Generally, the growth of silicon nanostructures occurs through the process known as VLS (vapour-liquid-solid). The name VLS refers to the fact that the process entails the silicon in vapour form passing into the liquid phase through a droplet of catalyst metal and, lastly, terminating as a solid.

According to said process, the substrate is covered by a thin layer of metal, in the order of ten or so nanometres which, once appropriately heated, liquefies and forms small droplets. The temperature required is generally much lower than the melting temperature of the metal, due to the reduced nanometric dimensions of the layer. The dimension of the droplets depends on the heating speed—the quicker the heating, the smaller the droplets—and can vary from ten or so to a few hundred nanometres. The substrate thus treated is exposed to a precursor gas containing silicon, such as silane ($SiH_4$) or silicon tetrachloride ($SiCl_4$), which breaks down in contact with the metal surface, which acts as a catalyst. Since the metal is at a higher temperature than the eutectic, the silicon dissolves inside the metal.

The subsequent supply of silicon in gas-phase makes the droplet of catalyst metal supersaturated with silicon, which deposits at the lower interface of the droplet towards the substrate. The continuation of this process results in the growth of a wire with the meniscus included in the droplet, now made of silicon-metal alloy, which remains on the top end of the structure in the growth phase.

As regards the electronic applications, the choice of the metal catalyst material is essential. In particular the metal must ensure that by reacting with the crystalline silicon it does not introduce recombination states which could compromise the electronic behaviour of the integrated circuit.

The VLS process as described above, however, cannot be applied when the substrate on which the SiNWs are grown is an integrated circuit. In fact, with the VLS process the growth temperature is a hundred or so degrees higher than the eutectic temperature of the metal in alloy with the silicon. In this regard, it is useful to consider that the eutectic temperature of the Ag—Si alloy is 850° C. and that of the Sn—Si alloy is 232° C. Silver or tin give rise to the formation of defects in the silicon that do not affect the electronic recombination.

As will be obvious for a person skilled in the art, the growth temperatures in the VLS process cannot be compatible with the CMOS integrated circuit. In fact, if the integrated circuit is complete with the metallization layers necessary for the electrical connections, the maximum admissible temperature is around 200° C. Heating the entire chip to temperatures sufficient to activate the VLP deposition therefore risks compromising the integrated circuit components.

The need was therefore felt to be able to carry out the VLS growth process of the SiNWs using an integrated circuit as a substrate, without this compromising the integrated circuit itself.

The inventor of the present invention has devised a solution, the technical characteristics of which are such as to guarantee that during the growth of SiNWs the substrate is heated to temperatures (<250° C.) such as to be compatible with a substrate consisting of a CMOS integrated circuit.

In particular, under the present invention only the nanometric droplets that represent the catalyst of the deposition process are heated to a higher temperature, thus leaving the substrate at a compatible temperature (200° C. or lower).

DISCLOSURE OF INVENTION

The subject of the invention is an assembly for the deposition of silicon nanostructures, the essential characteristics of which are described in claim 1, and the preferred and/or auxiliary characteristics of which are described in claims 2-7.

BRIEF DESCRIPTION OF THE DRAWINGS

An embodiment example is given below by way of non-limiting illustration with the help of the attached figures, in which.

BEST MODE FOR CARRYING OUT THE INVENTION

Figure 1:
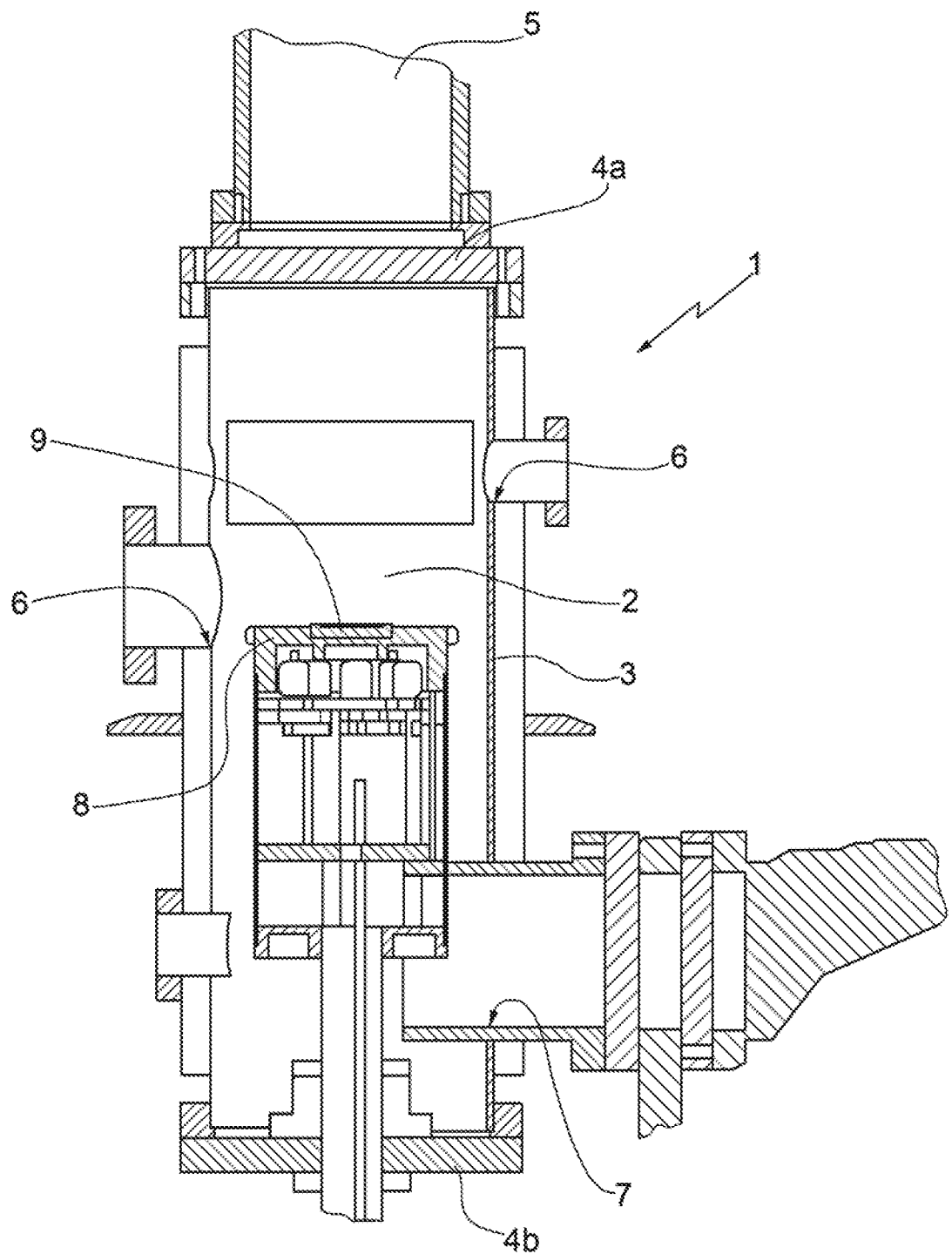
FIG. 1 is a schematic view of a preferred embodiment of the present invention.

In FIG. 1, the number 1 indicates overall the assembly for the deposition of silicon nanostructures according to the present invention.

The assembly 1 comprises a deposition chamber 2 defined by a cylindrically shaped side wall 3 and by two end walls 4a and 4b arranged to close the side wall 3. The side wall 3 and the two end walls 4a and 4b are made of steel. The assembly 1 comprises a microwave generator 5, for example a magnetron commercial generator at 2.45 GHz, illustrated only partially and useful for generation of the microwaves inside the deposition chamber 2. In particular, the microwave generator 5 faces the upper end wall 4a, which is made of quartz so as to allow the passage of the microwaves, at the same time ensuring the sealing of the vacuum in the deposition chamber 2.

In the side wall 3 two openings 6 are obtained in use connected to a system (known and not described for the sake of simplicity) to introduce silicon precursor gas into the deposition chamber 2 and at least one opening 7 in use connected to a vacuum pump (known and not described for the sake of simplicity) to generate inside the deposition chamber 2 a depression ranging between 0.1 and 100 mbar.

Figure 2:
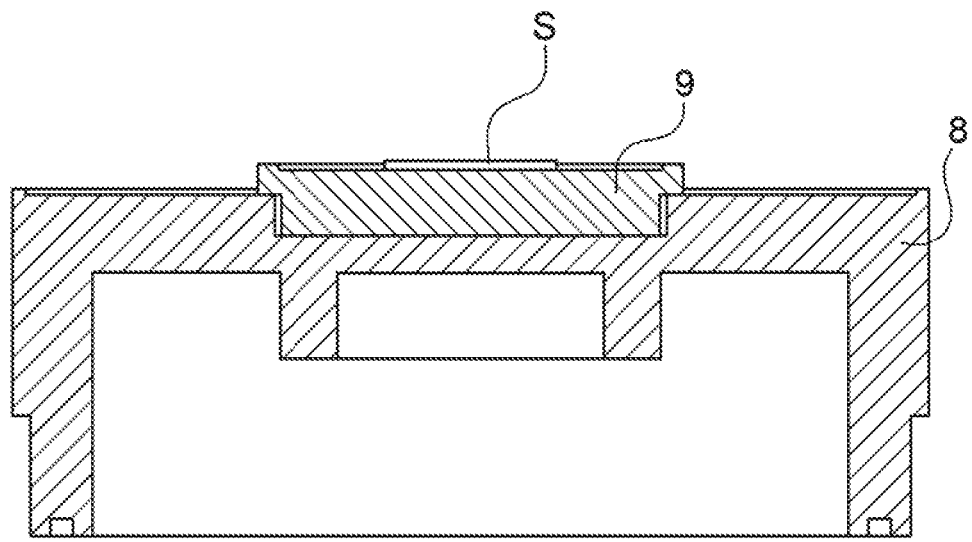
FIG. 2 is an enlargement of a detail of FIG. 1.
Figure 3:
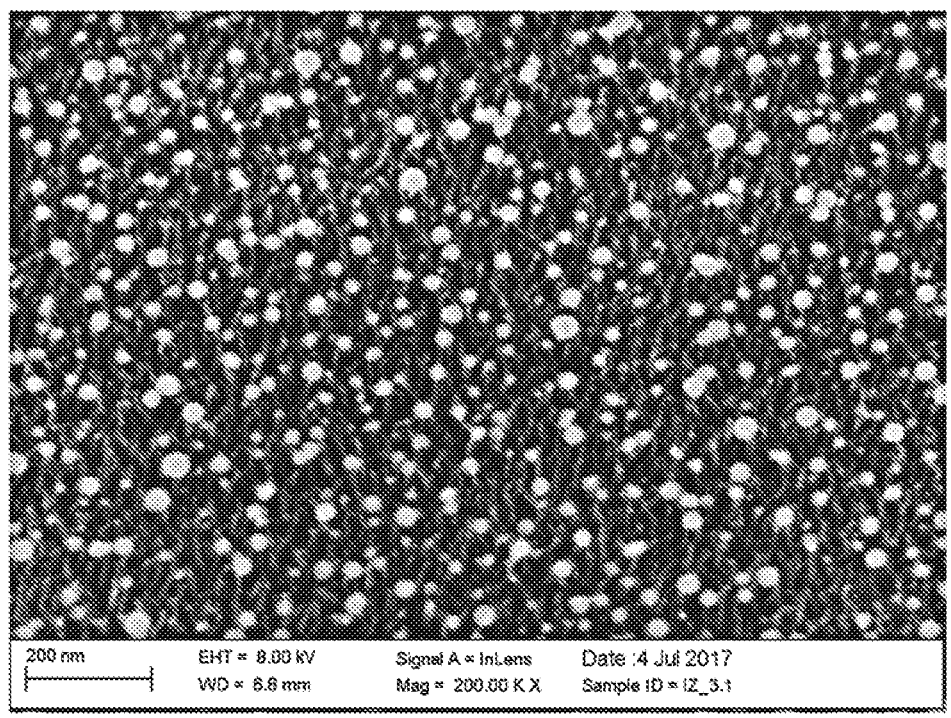
FIG. 3 is a SEM image of a sample produced with the assembly of the present invention.

As is also illustrated in FIG. 2, the assembly 1 according to the present invention comprises an electromagnetic termination wall 8, made of conducting material, reflecting the microwave radiation and housed inside the deposition chamber 2. Here and below, by "electromagnetic termination wall" we mean a reflecting conductive wall such as to represent a termination of the TE-mode waveguide.

Preferably, the electromagnetic termination wall 8 is made of a susceptor material such as, for example, graphite. In this case the termination wall 8 also has the function of representing also a first level heater of the sample. In fact, the graphite is heated by radiofrequency induction.

The assembly 1 according to the present invention comprises a substrate-carrier support 9 made of dielectric material and on which the substrate S is housed (such as, for example, an electronic circuit) on which to perform the growth of the SiNWs. As illustrated in FIG. 2, the substrate-carrier support 9 is arranged above the electromagnetic termination wall 8 with a free surface facing the microwave generator 5.

The substrate-carrier support 8, being made of dielectric material, is able to withstand the process temperatures, and must also be able to withstand the chemical reactivity of the silane.

Preferably, the substrate-carrier support 9 can be made of ceramic, for example boron nitride.

In particular, the substrate-carrier support 9 has the purpose of spacing the substrate, on which the droplets of catalyst metal are deposited, from the conductive termination wall 8 where the tangential electric field is annulled. The presence of an electric field other than zero, due to the presence of the dielectric material, allows heating of the metal droplets.

In fact, at the microwave frequencies only the conduction on the surface of the metal materials is activated, according to the so-called "skin effect". At the frequency of 2.45 GHz, for example, the conduction in aluminium occurs only in the first micron of depth from the surface exposed to the radiation.

Furthermore, the walls of the chamber, thick and very conductive, behave, to a good approximation, like ideal metals, by annulling the tangential electric field of the radiation on the surface.

In other words, the assembly subject of the present invention is structured to perform a deposition of SiNWs by conveying the microwaves into a cylindrical chamber made of steel, with controlled environment and precursor gas flow. In particular, as will be obvious and easy to implement for a person skilled in the art, the sizes of the deposition chamber 2 must be chosen so as to cause propagation of only the first electromagnetic TE mode, at the frequency of the generator microwaves and, therefore, ensure good uniformity of the field in all its sections.

Lastly, the deposition conditions must ensure that the plasma does not ignite due to the microwaves. In fact, the plasma, producing ionization of the gas, would produce deposition of amorphous material, inhibiting or covering the growth of the crystalline nanostructures, in particular of the nanowires. Also this precaution is part of the normal practice of a person skilled in the art.

The characterizing element of the deposition assembly according to the present invention consists in the presence of the substrate-carrier support 9 made of dielectric material and adapted to maintain the support on which to perform the growth of SiNWs in a position separate from the surface of the termination wall 8. In this way, due to the presence of the dielectric material, the layer of nanometric droplets of catalyst metal is spaced from the terminal conductive surface and the tangential electric field is not null. Under the action of the tangential electric field, the metal droplets absorb the EM energy and heat up while the substrate, made of silicon for example, having a lower conductivity than the metal droplets, heats up to a lesser extent.

In principle, in an integrated circuit also the circuit substrate, made of silicon with normally moderate doping, can be considered at the frequencies of the microwaves a dielectric which, therefore, offers a separation between the layer of metal droplets and the electromagnetic termination wall 8. However, said separation is small due to the reduced thickness of the substrate usually used in integrated circuits, and therefore much less effective than the separation offered by the presence of the substrate-carrier support 9.

The metal connection layers on the surface of the substrate (for example CMOS chip), on which the growth of the nanowires will be performed, can be screened by a thicker metal layer. This metal layer, made for example of silver, and with a thickness varying between 200-300 nm, is able to withstand the currents induced by the electromagnetic field, reflecting it, and therefore without heating up. The assembly according to the present invention therefore guarantees that heating of portions of substrate is avoided by covering it with thicker highly conductive metal layers, of silver for example. The presence of said metal layers, in fact, reduces absorption of the electromagnetic energy, which is reflected to a greater extent.

In addition to avoiding damage to the underlying structure, the lesser heating avoids the growth on said areas, allowing accurate definition of the areas deposited.

An embodiment example obtained with the assembly subject of the present invention is described below.

Floating zone type silicon substrates were used measuring 1 $cm^2$ with thickness 250 micron and orientation 1.0.0. The silicon wafers were cleaned with an RCA solution. Subsequently, the silicon substrates were oxidized with a wet process at 300° C.

5 nm of tin were deposited outside the deposition chamber.

The substrate was then heated to 450° C. in a vacuum chamber with pressure $1 \times 10^{-6}$ mbar using a rapid heating regime to ensure very small droplets. The final hardening was achieved in 8 minutes. The temperature was measured with a thermocouple in contact with the lower side of the substrate.

Figure 4:
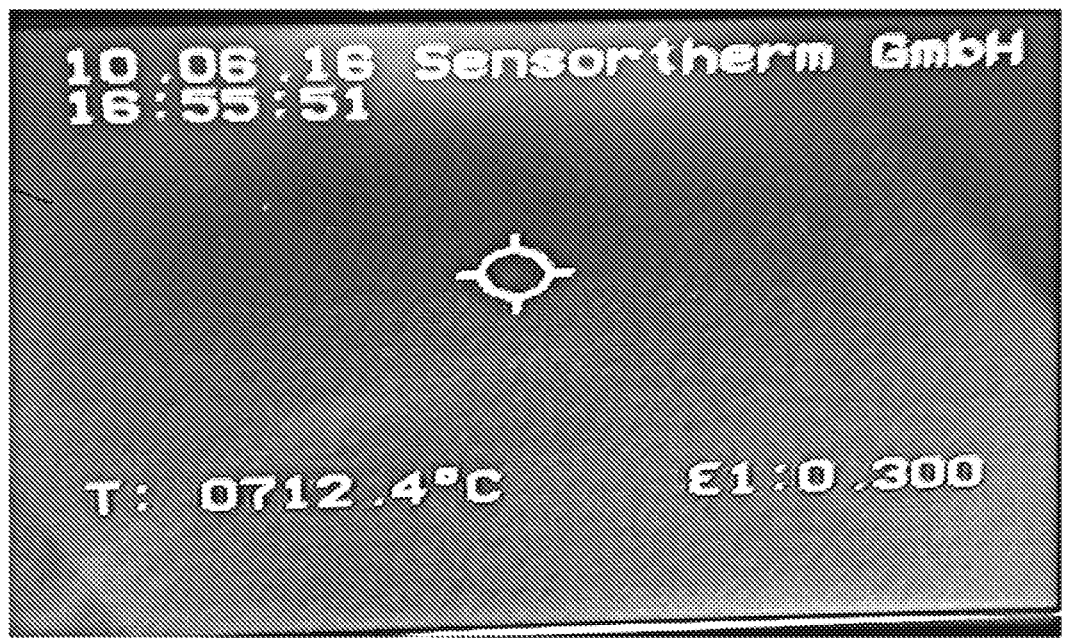
FIG. 4 is an image that shows evidence of the heating process of the termination wall made of a susceptor material obtained by means of image with pyrometer.

After slow cooling (30 minutes) at 200° C., the surface of the substrate was heated by means of microwave irradiation using a power of 450 W. Due to this heating on the portion of termination wall covered with susceptor material, a temperature of 712° C. is reached while the substrate is at the temperature of 200° C. See FIG. 4.

For this measurement the coefficient of emissivity was chosen equal to 0.3 obtained by comparing the T measured by the thermocouple and by the pyrometer in stationary conditions.

After the cooling, the sample was exposed to a flow of pure $SiH_4$ of 4.5 sccm with a pressure in the chamber of 3 mbar. The microwave generator was then switched on at a power of 250 W.

The electromagnetic coupling was adjusted to increase the reflection coefficient to 75% ensuring that the plasma was not activated.

In these conditions a droplet temperature of 485° C. was estimated higher than the eutectic point of the Si—Sn alloy.

The effect of the microwaves was to cause heating of the droplets of Sn beyond the T of the eutectic and, consequently, triggering of the VLP mechanism of growth of the SiNWs. Figure shows the nanowires obtained with a power of 250 W and an estimated T of 450° C. This sample shows the growth of regular nanowires with a diameter of 10 nm and the uniform presence of metal droplets at the top of the Si wires. It has been found that by increasing the power, an excess of material is deposited which covers the droplets.

As is evident from the above description, the assembly for the deposition of SiNWs according to the present invention allows the use of very widespread processes for the production of sensors with high production levels, and therefore limited costs.

The availability of a technology for the production of sensors integrated in CMOS circuits allows the production of sensors directly connected to the control and reading circuits, if necessary also to the circuits for transmission of the information from the sensor towards a control radio base station.

Said invention allows sensors to be obtained distributed in the environment, for monitoring climatic conditions or contaminants, or biological sensors in direct contact with the patient or implantable.

In particular, the assembly of the present invention is advantageously applied in the production of CMOS technology integrated chemical and biological sensors, in the production of batteries and in the production of photovoltaic cells.

The invention claimed is:

1. An assembly (1) for the deposition of silicon nanostructures comprising a deposition chamber (2), which is defined by a side wall (3) and by two end walls (4); said assembly (1) being characterized in that it comprises:
a microwave generator (5), which is adapted to generate microwaves inside the deposition chamber (2), an electromagnetic termination wall (8), made of a conductor material and reflecting the microwave radiation, which is such as to create a termination for a TE-mode waveguide and is housed inside the deposition chamber (2), and a substrate-carrier support (9), which is made of a dielectric material and on which the substrate is housed on which to perform the growth of silicon nanostructures; said substrate-carrier support (9) being arranged inside the deposition chamber (2) above said termination wall (8); and a metal layer arranged on a substrate (S) where the deposition is going to take place; said metal layer being arranged so as to cover a surface of the substrate (S) where the growth of nanowires is not wanted.

2. The assembly (1) for the deposition of silicon nanostructures according to claim 1, characterized in that said termination wall (8) is made of a susceptor material.

3. The assembly (1) for the deposition of silicon nanostructures according to claim 2, characterized in that said termination wall (8) is made of graphite.

4. The assembly (1) for the deposition of silicon nanostructures according to claim 1, characterized in that said side wall (3) and said two end walls (4) are made of steel.

5. The assembly (1) for the deposition of silicon nanostructures according to claim 1, characterized in that in said side wall (3) two openings (6, 7) are obtained, which are adapted to be connected to a system to introduce gas into the deposition chamber (2) and to a vacuum pump, which is such as to generate a depression inside the deposition chamber (2) ranging from 0.1 to 100 mbar.

6. The assembly (1) for the deposition of silicon nanostructures according to claim 1, characterized in that said substrate-carrier support (9) is made of ceramic.

7. The assembly (1) for the deposition of silicon nanostructures according to claim 6, characterized in that said substrate-carrier support (9) is made of boron nitride.

8. The assembly (1) for the deposition of silicon nanostructures according to claim 1, characterized in that the conditions of deposition through microwave excitation ensure that the plasma does not ignite.

* * * * *